United States Patent
Lee et al.

(10) Patent No.: US 10,127,876 B2
(45) Date of Patent: Nov. 13, 2018

(54) GATE DRIVING CIRCUIT AND DISPLAY DEVICE INCLUDING THE SAME

(71) Applicant: SAMSUNG DISPLAY CO., LTD., Yongin-si, Gyeonggi-do (KR)

(72) Inventors: Kye-uk Lee, Hwaseong-si (KR); Kee-bum Park, Cheonan-si (KR); Sihyun Ahn, Asan-si (KR); Jaewon Kim, Asan-si (KR); Byoungsun Na, Seoul (KR); Yoomi Ra, Ansan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 65 days.

(21) Appl. No.: 15/159,721

(22) Filed: May 19, 2016

(65) Prior Publication Data

US 2017/0084239 A1    Mar. 23, 2017

(30) Foreign Application Priority Data

Sep. 22, 2015 (KR) .......................... 10-2015-0134066

(51) Int. Cl.
*G09G 3/36* (2006.01)
*G09G 3/20* (2006.01)

(52) U.S. Cl.
CPC ......... *G09G 3/3677* (2013.01); *G09G 3/2003* (2013.01); *G09G 3/3688* (2013.01); *G09G 2320/02* (2013.01)

(58) Field of Classification Search
CPC .. G09G 3/3611; G09G 3/3674; G09G 3/3677; G09G 3/2003; G09G 3/3688; G09G 2320/02
See application file for complete search history.

(56) References Cited

U.S. PATENT DOCUMENTS

| 5,747,979 A * | 5/1998 | Nagai ................... G09G 3/3692 |
| | | 323/349 |
| 2009/0009498 A1* | 1/2009 | Nishimura ........... G09G 3/3688 |
| | | 345/205 |
| 2011/0254002 A1 | 10/2011 | Ahn |
| 2013/0321499 A1* | 12/2013 | Park ........................ G09G 3/20 |
| | | 345/698 |

FOREIGN PATENT DOCUMENTS

| KR | 10-2014-0020391 A | 2/2014 |
| KR | 10-2014-0093547 A | 7/2014 |
| KR | 10-2014-0112290 A | 9/2014 |

* cited by examiner

*Primary Examiner* — Amr Awad
*Assistant Examiner* — Wing Chow
(74) *Attorney, Agent, or Firm* — Lewis Roca Rothgerber Christie LLP (57) ABSTRACT

A gate driving circuit includes a plurality of stages, a k-th stage (where k is a natural number) of the plurality of stages being configured to receive a clock signal, a (k−1)-th carry signal from a (k−1)-th stage of the plurality of stages, a (k+1)-th carry signal from a (k+1)-th stage of the plurality of stages, a (k+2)-th carry signal from a (k+2)-th stage of the plurality of stages, a first ground voltage, a second ground voltage, and a third ground voltage, and to output a k-th gate signal and a k-th carry signal, the k-th stage including a first pull down circuit configured to discharge the k-th gate signal as the third ground voltage in response to the (k+1)-th carry signal, and the third ground voltage having a lower voltage level than the first ground voltage and having a higher voltage level than the second ground voltage.

12 Claims, 6 Drawing Sheets

GATE DRIVING CIRCUIT AND DISPLAY DEVICE INCLUDING THE SAME

CROSS-REFERENCE TO RELATED APPLICATIONSh

This patent application claims priority to and the benefit of Korean Patent Application No. 10-2015-0134066, filed on Sep. 22, 2015, in the Korean Intellectual Property Office (KIPO), the entire content of which is hereby incorporated by reference.

BACKGROUND

The present disclosure herein relates to a gate driving circuit and a display device including the same.

A display device includes a plurality of gate lines, a plurality of data lines, and a plurality of pixels connected to the plurality of gate lines and the plurality of data lines. The display device includes a gate driving circuit for sequentially providing gate signals to the plurality of gate lines and a data driving circuit for outputting data signals to the plurality of data lines.

The gate driving circuit includes a shift register with a plurality of driving circuits (hereinafter referred to as driving stages). The plurality of driving stages respectively output gate signals corresponding to the plurality of gate lines. Each of the plurality of driving stages includes a plurality of transistors.

When frequencies of gate signals outputted from the gate driving circuit are the same, as the resolution of the display device increases, a time for charging each pixel with electric charges decreases. Pixel charging time reduction may cause the quality of a display image to deteriorate.

SUMMARY

Aspects of one or more embodiments of the present invention are directed toward a gate driving circuit for reducing a delay of a gate signal.

Aspects of one or more embodiments of the present invention are directed toward a display device including the gate driving circuit for reducing the delay of the gate signal.

According to some embodiments of the present invention, there is provided a gate driving circuit including a plurality of stages, a k-th stage (where k is a natural number) of the plurality of stages being configured to receive a clock signal, a (k−1)-th carry signal from a (k−1)-th stage of the plurality of stages, a (k+1)-th carry signal from a (k+1)-th stage of the plurality of stages, a (k+2)-th carry signal from a (k+2)-th stage of the plurality of stages, a first ground voltage, a second ground voltage, and a third ground voltage, and to output a k-th gate signal and a k-th carry signal, the k-th stage including a first pull down circuit configured to discharge the k-th gate signal as the third ground voltage in response to the (k+1)-th carry signal, and the third ground voltage having a lower voltage level than the first ground voltage and having a higher voltage level than the second ground voltage.

In an embodiment, the k-th stage further includes a second pull-down circuit configured to discharge the k-th carry signal as the second ground voltage in response to the (k+1)-th carry signal.

In an embodiment, the second pull-down circuit includes a transistor including a first electrode connected to the k-th gate signal, a second electrode connected to the third ground voltage, and a gate electrode connected to the (k+1)-th carry signal.

In an embodiment, the k-th stage includes: a controller configured to provide one of the clock signal and the second ground voltage to a first node in response to the clock signal, the (k−1)-th carry signal, and the (k+1)-th carry signal; and a first output circuit configured to output the clock signal as the k-th gate signal in response to a signal at the first node.

In an embodiment, the k-th stage further includes a second output circuit configured to output the clock signal as the k-th carry signal in response to the signal at the first node.

In an embodiment, the k-th stage further includes: an inverter configured to provide the clock signal to a second node; a first discharge circuit configured to discharge the first node to the second ground voltage in response to a signal at the second node and discharge the second node to the second ground voltage in response to the (k−1)-th carry signal; a second discharge circuit configured to discharge the k-th carry signal as the second ground voltage in response to the signal at the second node; and a third discharge circuit configured to discharge the k-th gate signal as the first ground voltage in response to the signal at the second node.

According to some embodiments of the present invention, there is provided a display device including: a display panel including a plurality of pixels respectively connected to a plurality of gate lines and a plurality of data lines; a gate driving circuit including a plurality of stages configured to output gate signals to the plurality of gate lines; and a data driving circuit configured to drive the plurality of data lines, wherein a k-th stage (where k is a natural number) among the plurality of stages is configured to receive a clock signal, a (k−1)-th carry signal from a (k−1)-th stage among the plurality of stages, a (k+1)-th carry signal from a (k+1)-th stage among the plurality of stages, a (k+2)-th carry signal from a (k+2)-th stage among the plurality of stages, a first ground voltage, a second ground voltage, and a third ground voltage, and to output a k-th gate signal and a k-th carry signal, wherein the k-th stage includes a first pull down circuit configured to discharge the k-th gate signal as the third ground voltage in response to the (k+1)-th carry signal, and wherein the third ground voltage has a lower voltage level than the first ground voltage and has a higher voltage level than the second ground voltage.

In an embodiment, the k-th stage further includes a second pull-down circuit configured to discharge the k-th carry signal as the second ground voltage in response to the (k+1)-th carry signal.

In an embodiment, the second pull-down circuit includes a transistor including a first electrode connected to the k-th gate signal, a second electrode connected to the third ground voltage, and a gate electrode connected to the (k+1)-th carry signal.

In an embodiment, the k-th stage includes: a controller configured to provide one of the clock signal and the second ground voltage to a first node in response to the clock signal, the (k−1)-th carry signal, and the (k+1)-th carry signal; and a first output circuit configured to output the clock signal as the k-th gate signal in response to a signal at the first node.

In an embodiment, the k-th stage further includes a second output circuit configured to output the clock signal as the k-th carry signal in response to the signal at the first node.

In an embodiment, the k-th stage further includes: an inverter configured to provide the clock signal to a second node; a first discharge circuit configured to discharge the first node to the second ground voltage in response to a signal at the second node and discharge the second node to the second ground voltage in response to the (k−1)-th carry signal; a second discharge circuit configured to discharge the k-th carry signal as the second ground voltage in response to the signal at the second node; and a third discharge circuit configured to discharge the k-th gate signal as the first ground voltage in response to the signal at the second node.

In an embodiment, the display panel has a display area where the plurality of pixels are arranged, and a non-display area adjacent to the display area, wherein the gate driving circuit is integrated in the non-display area.

In an embodiment, the first ground voltage and the second ground voltage have different voltage levels.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Hereinafter, embodiments of the inventive concept are described in more detail with reference to the accompanying drawings.

Figure 1:
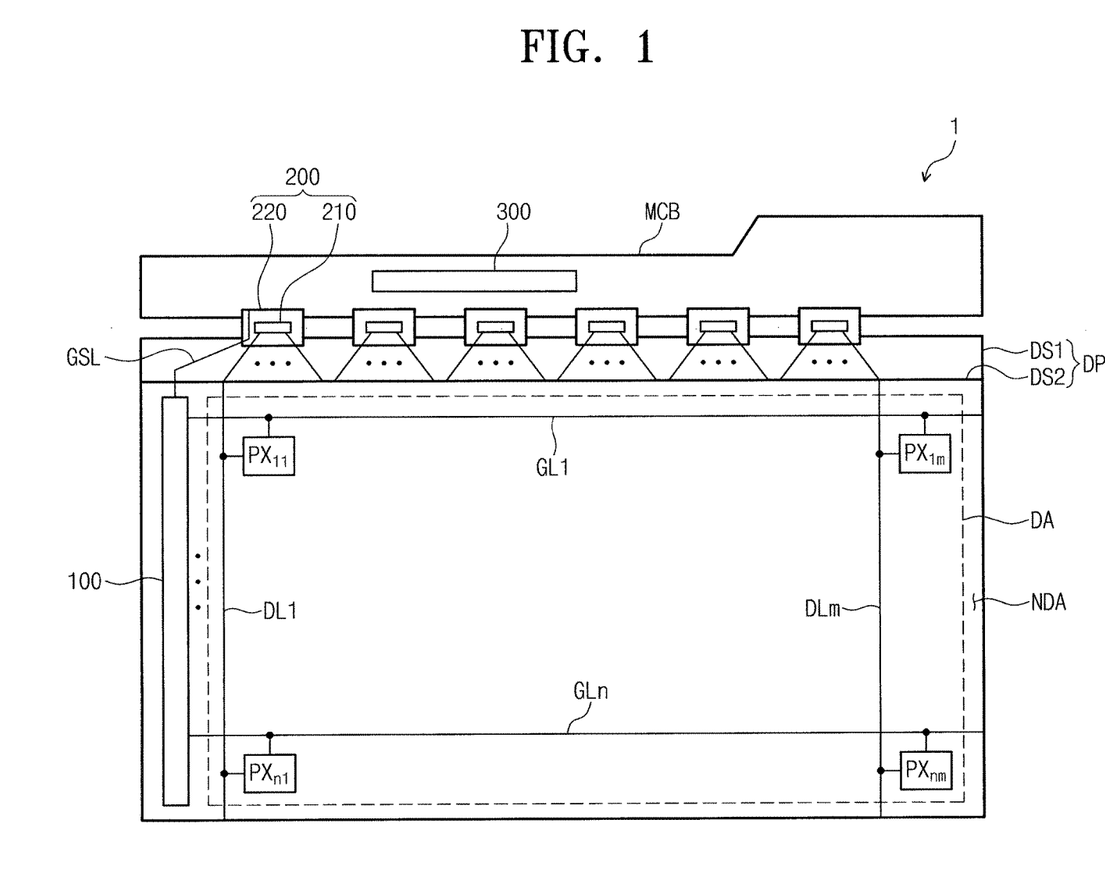
FIG. 1 is a plan view of a display device according to an embodiment of the inventive concept.
Figure 2:
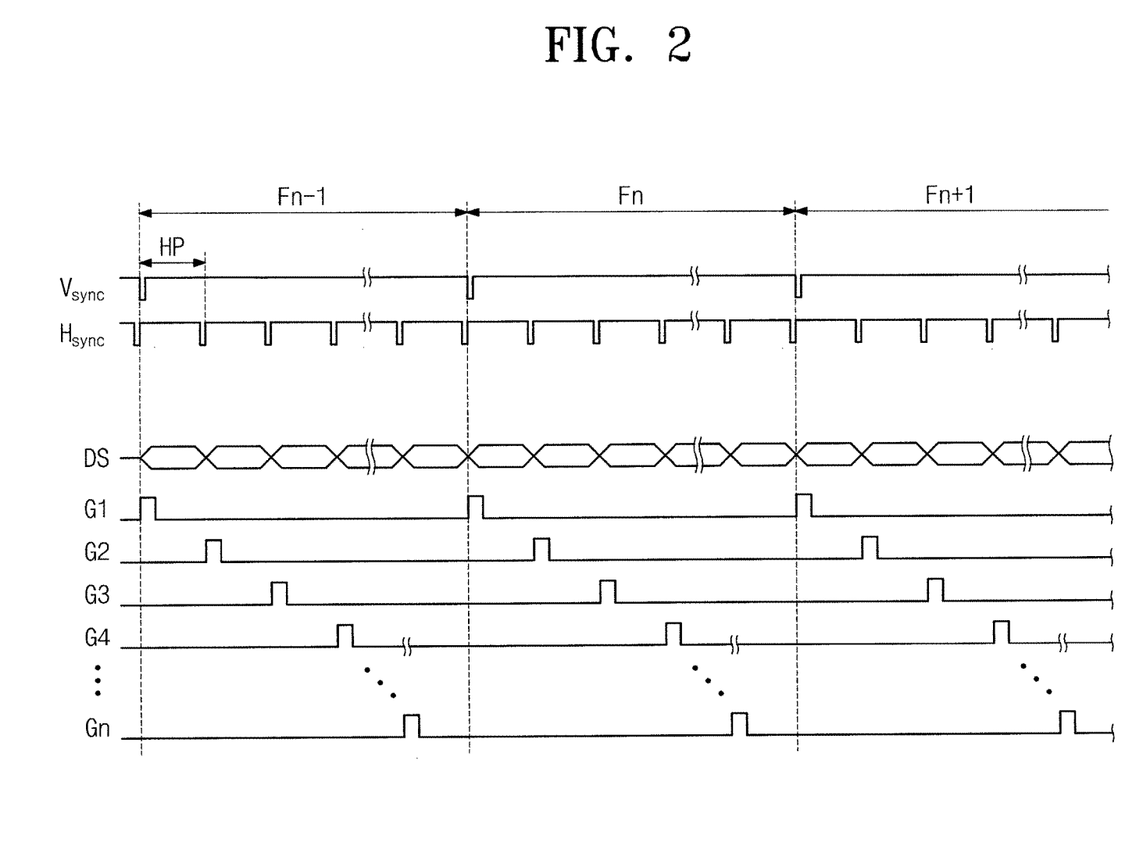
FIG. 2 is a timing diagram illustrating signals of a display device according to an embodiment of the inventive concept.

FIG. 1 is a plan view of a display device 1 according to an embodiment of the inventive concept. FIG. 2 is a timing diagram illustrating signals of the display device 1 according to an embodiment of the inventive concept.

As shown in FIGS. 1 and 2, the display device 1 according to an embodiment of the inventive concept includes a display panel DP, a gate driving circuit 100, a data driving circuit 200, and a driving controller 300.

The display panel DP is not particularly limited and, for example, may include various suitable display panels such as a liquid crystal display panel, an organic light emitting display panel, an electrophoretic display panel, and/or an electrowetting display panel. In this embodiment, the display panel DP is described as a liquid crystal display panel. A liquid crystal display device including a liquid crystal display panel may further include a polarizer and a backlight.

The display panel DP includes a first substrate DS1, a second substrate DS2 spaced apart from the first substrate DS1, and a liquid crystal layer LCL disposed between the first substrate DS1 and the second substrate DS2. On a plane (in a plan view), the display panel DP includes a display area DA where a plurality of pixels PX11 to PXnm is disposed and a non-display area NDA surrounding the display area DA.

The display panel DP includes a plurality of gate lines GL1 to GLn disposed on the first substrate DS1 and a plurality of data lines DL1 to DLm crossing the plurality of gate lines GL1 to GLn. The plurality of gate lines GL1 to GLn is connected to the gate driving circuit 100. The plurality of data lines DL1 to DLm are connected to the data driving circuit 200. For ease of illustration, only some of the plurality of gate lines GL1 to GLn and some of the plurality of data lines DL1 to DLm and only some of the plurality of pixels PX11 to PXnm are illustrated in FIG. 1. The plurality of pixels PX11 to PXnm are respectively connected to corresponding gate lines among the plurality of gate lines GL1 to GLn and corresponding data lines among the plurality of data lines DL1 to DLm.

The plurality of pixels PX11 to PXnm may be divided into a plurality of groups according to a color displayed. The plurality of pixels PX11 to PXnm may display one of the primary colors. The primary colors may include red, green, blue, and white. However, embodiments of the inventive concept are not limited thereto and thus the primary colors may further include various colors such as yellow, cyan, magenta, and/or any other suitable color.

The gate driving circuit 100 and the data driving circuit 200 receive a control signal from the driving controller 300. The driving controller 300 may be mounted on a main circuit board MCB. The driving controller 300 receives image data and control signals from an external graphic controller. The control signals may include vertical sync signals Vsync that are signals for distinguishing frame sections Fn−1, Fn, and Fn+1, horizontal sync signals Hsync that are signals for distinguishing horizontal sections HP, that is, row distinction signals, data enable signals (that are in high level only during a section where data is outputted to display a data incoming area), and clock signals.

The gate driving circuit 100 generates gate signals G1 to Gn on the basis of a control signal (hereinafter referred to as a gate control signal) received from the driving controller 300 through a signal line GSL and outputs the gate signals G1 to Gn to the plurality of gate lines GL1 to GLn, during the frame sections Fn−1, Fn, and Fn+1. The gate signals G1 to Gn may be sequentially outputted in correspondence to the horizontal sections HP. The gate driving circuit 100 and the pixels PX11 to PXnm may be formed concurrently or simultaneously through a thin film process. For example, the gate driving circuit 100 may be mounted as an oxide semiconductor thin film transistor gate driver circuit (OSG) in the non-display area NDA.

FIG. 1 illustrates a gate driving circuit 100 connected to the left ends of the plurality of gate lines GL1 to GLn. According to an embodiment of the inventive concept, the display device 1 may include two gate driving circuits. One of the two gate driving circuits may be connected to the left ends of the plurality of gate lines GL1 to GLn and the other one may be connected to the right ends of the plurality of gate lines GL1 to GLn. Additionally, one of the two gate driving circuits may be connected to odd gate lines and the other one may be connected to even gate lines.

The data driving circuit 200 generates gray level voltages according to image data provided from the driving controller 300 on the basis of a control signal (hereinafter referred to as a data control signal) received from the driving controller 300. The data driving circuit 200 outputs the gray level voltages as data voltages DS to the plurality of data lines DL1 to DLm.

The data voltages DS may include positive data voltages having a positive value with respect to a common voltage and/or negative data voltages having a negative value with respect to the common voltage. Some of data voltages applied to the data lines DL1 to DLm have a positive polarity and others have a negative polarity during each of the horizontal sections HP. The polarity of the data voltages DS may be inverted according to the frame sections Fn−1, Fn, and Fn+1 in order to reduce or prevent the deterioration of a liquid crystal. The data driving circuit 200 may generate data voltages inverted by each frame section unit in response to an invert signal.

The data driving circuit 200 may include a driving chip 210 and a flexible circuit board 220 mounted on the driving chip 210. The data driving circuit 200 may include a plurality of driving chips 210 and the flexible circuit board 220. The flexible circuit board 220 electrically connects the main circuit board MCB and the first substrate DS1. The plurality of driving chips 210 provide data signals corresponding to corresponding data lines among the plurality of data lines DL1 to DLm.

FIG. 1 illustrates a tape carrier package (TCP) type (kind) data driving circuit 200 as an example. According to another embodiment of the inventive concept, the data driving circuit 200 may be disposed on the non-display area NDA of the first substrate DS1 through a chip on glass (COG) arrangement.

Figure 3:
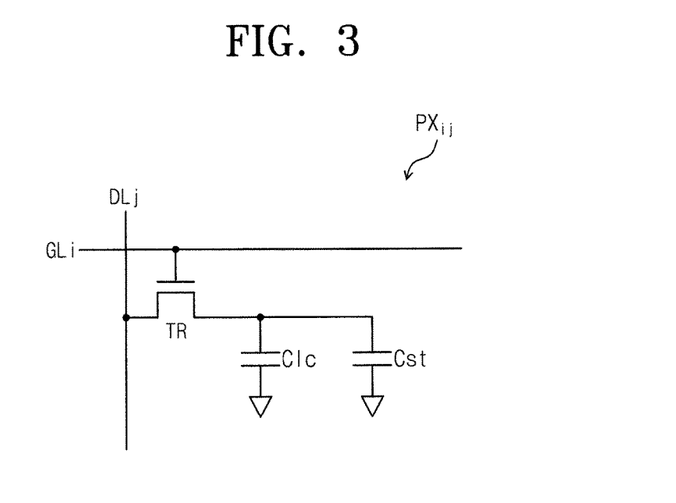
FIG. 3 is an equivalent circuit diagram of a pixel according to an embodiment of the inventive concept.
Figure 4:
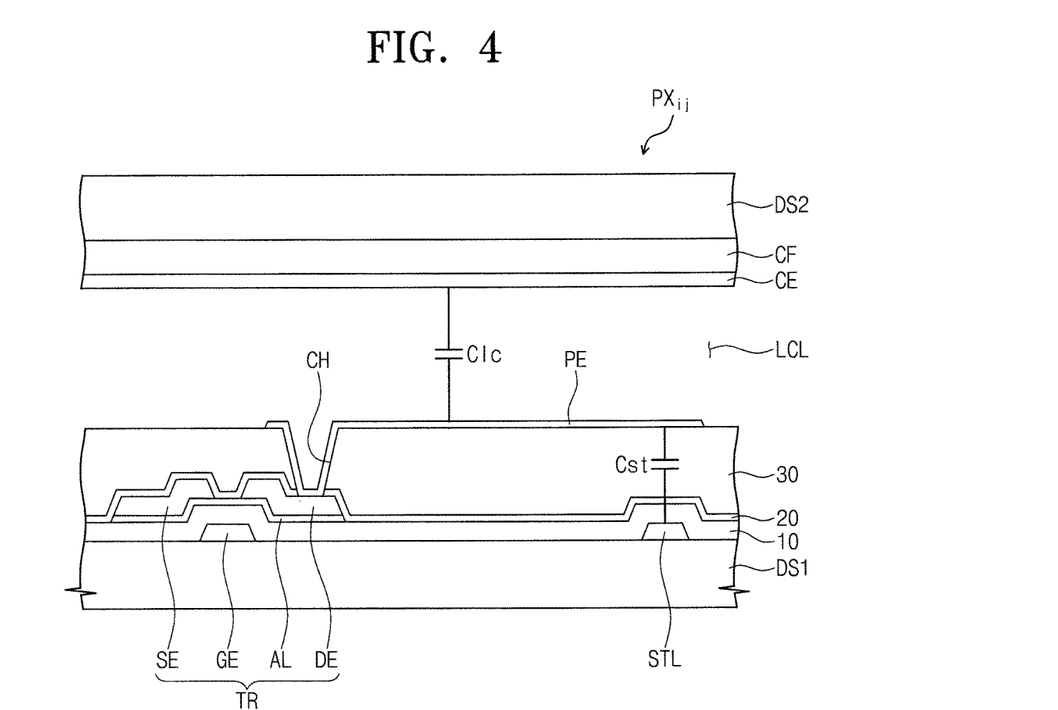
FIG. 4 is a sectional view of a pixel according to an embodiment of the inventive concept.

FIG. 3 is an equivalent circuit diagram of a pixel according to an embodiment of the inventive concept. FIG. 4 is a sectional view of a pixel according to an embodiment of the inventive concept. Each of the plurality of pixels PX11 to PXnm shown in FIG. 1 may have an equivalent circuit shown in FIG. 3.

As shown in FIG. 3, the pixe l3 PXij includes a pixel thin film transistor (hereinafter referred to as a pixel transistor) TR, a liquid crystal capacitor Clc, and a storage capacitor Cst. Hereinafter, a transistor refers to a thin film transistor. According to an embodiment of the inventive concept, the storage capacitor Cst may be omitted.

The pixel transistor TR is electrically connected to an ith gate line GLi and a jth data line DLj. The pixel transistor TR outputs a pixel voltage corresponding to a data signal received from the jth data line DLj in response to a gate signal received from the ith gate line GLi.

The liquid crystal capacitor Clc is charged with a pixel voltage outputted from the pixel transistor TR. An arrangement of liquid crystal directors included in a liquid crystal layer LCL (see FIG. 4) is changed according to a charge amount charged in the liquid crystal capacitor CLC. The light incident on a liquid crystal layer may be transmitted or blocked according to an arrangement of liquid crystal directors.

The storage capacitor Cst is connected in parallel to the liquid crystal capacitor Clc. The storage capacitor Cst maintains an arrangement of liquid crystal directors during a set or predetermined section.

As shown in FIG. 4, the pixel transistor TR includes a control electrode (e.g., gate electrode) GE connected to the ith gate line GLi (see FIG. 3), an activation layer AL overlapping the control electrode GE, a first electrode SE connected to the jth data line DLj (see FIG. 3), and a second electrode DE spaced apart from the first electrode SE.

The liquid crystal capacitor Clc includes a pixel electrode PE and a common electrode CE. The storage capacitor Cst includes the pixel electrode PE and a portion of a storage line STL overlapping the pixel electrode PE.

The ith gate line GLi and the storage line STL are disposed on one surface of the first substrate DS1. The control electrode GE is branched from the ith gate line GLi. The ith gate line GLi and the storage line STL may include a metal (e.g., Al, Ag, Cu, Mo, Cr, Ta, Ti, and/or the like) or an alloy thereof. The ith gate line GLi and the storage line STL may have a multi-layer structure, and for example, may include a Ti layer and a Cu layer.

A first insulating layer 10 covering the control electrode GE and the storage line STL is disposed on one surface of the first substrate DS1. The first insulating layer 10 may include at least one of an inorganic material and an organic material. The first insulating layer 10 may be an organic layer or an inorganic layer. The first insulating layer 10 may have a multi-layer structure and for example, may include a silicon nitride layer and a silicon oxide layer.

The activation layer AL overlapping the control electrode GE is disposed on the first insulating layer 10. The activation layer AL may include a semiconductor layer and an ohmic contact layer. The semiconductor layer is disposed on the first insulating layer 10, and the ohmic contact layer is disposed on the semiconductor layer.

The second electrode DE and the first electrode SE are disposed on the activation layer AL. The second electrode DE and the first electrode SE are spaced apart from each other. Each of the second electrode DE and the first electrode SE partially overlaps the control electrode GE.

A second insulating layer 20 (covering the activation layer AL, the second electrode DE, and the first electrode SE) is disposed on the first insulating layer 10. The second insulating layer 20 may include at least one of an inorganic material and an organic material. The second insulating layer 20 may be an organic layer or an inorganic layer. The second insulating layer 20 may have a multi-layer structure and for example, may include a silicon nitride layer and a silicon oxide layer.

Although the pixel transistor TR having a staggered structure is exemplarily shown in FIG. 1, a structure of the pixel transistor TR is not limited thereto. For example, the pixel transistor TR may have a planar structure.

A third insulating layer 30 is disposed on the second insulating layer 20. The third insulating layer 30 provides a flat surface. The third insulating layer 30 may include an organic material.

The pixel electrode PE is displayed on the third insulating layer 30. The pixel electrode PE is connected to the second electrode DE through a contact hole (or contact opening) CH penetrating the second insulating layer 20 and the third insulating layer 30. An alignment layer covering the pixel electrode PE may be disposed on the third insulating layer 30.

A color filter layer CF is disposed on one surface of the second substrate DS2. A common electrode CE is disposed on the color filter layer CF. A common voltage is applied to the common electrode CE. A common voltage and a pixel voltage have different values. An alignment layer covering the common electrode CE may be disposed on the common electrode CE. Another insulating layer may be disposed between the color filter layer CF and the common electrode CE.

The pixel electrode PE and the common electrode CE with the liquid crystal layer LCL therebetween form the liquid crystal capacitor Clc. Additionally, portions of the pixel electrode PE and the storage line STL, which are disposed with the first insulating layer 10, the second insulating layer 20, and the third insulating layer 30 therebetween, form the storage capacitor Cst. The storage line STL receives a storage voltage having a different value than a pixel voltage. A storage voltage may have the same value as a common voltage.

On the other hand, a section of the pixel PXij shown in FIG. 3 is just one example. Unlike FIG. 3, at least one of the color filter layer CF and the common electrode CE may be disposed on the first substrate DS1. That is, a liquid display panel according to this embodiment of the inventive concept may include a pixel in a vertical alignment (VA) mode, a patterned vertical alignment (PVA) mode, an in-plane switching (IPS) mode, a fringe-field switching (FFS) mode, or a plane-to-line switching (PLS) mode.

Figure 5:
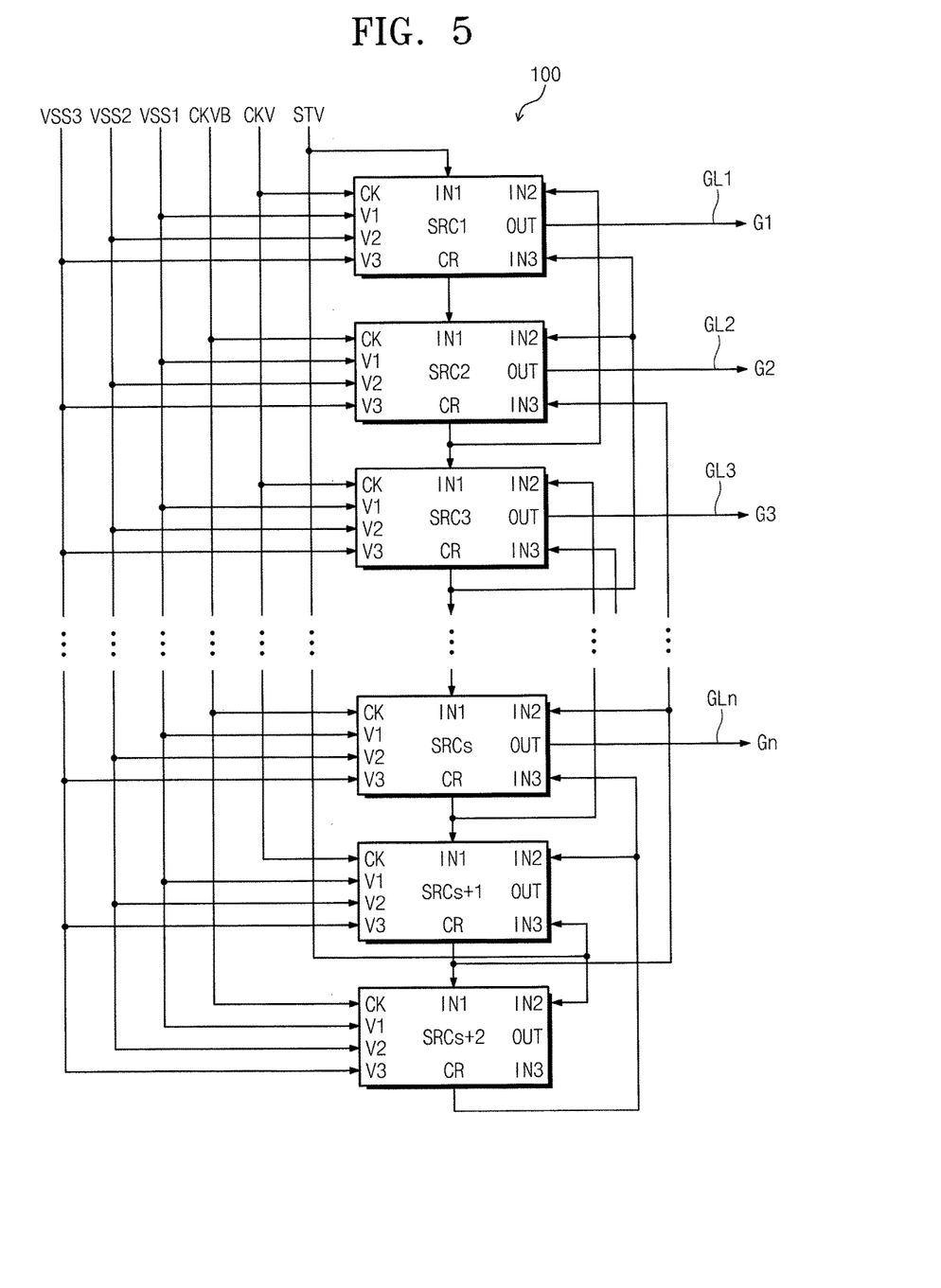
FIG. 5 is a block diagram illustrating a gate driving circuit according to an embodiment of the inventive concept.

FIG. 5 is a block diagram illustrating a gate driving circuit 100 according to an embodiment of the inventive concept.

As shown in FIG. 5, the gate driving circuit 100 includes a plurality of driving stages SRC1 to SRCs and dummy driving stages SRCs+1 and SRCs+2. The plurality of driving stages SRC1 to SRCs and the dummy driving stage SRCs+1 have a cascade relationship in which they operate in response to a carry signal outputted from a previous stage and a carry signal outputted from the next stage.

Each of the plurality of driving stages SRC1 to SRCs receives a first clock signal CKV a second clock signal CKVB, a first ground voltage VSS1, a second ground voltage VSS2, and a third ground voltage VSS3, from the driving controller 300 shown in FIG. 1. The driving stage SRC1 and the dummy driving stages SRCs+1 and SRCs+2 further receive a start signal STV.

According to this embodiment of the inventive concept, the plurality of driving stages SRC1 to SRCs are respectively connected to the plurality of gate lines GL1 to GLn. The plurality of driving stages SRC1 to SRCs respectively provide gate signals to the plurality of gate lines GL1 to GLn. According to an embodiment of the inventive concept, gate lines connected to the plurality of driving stages SRC1 to SRCs may be odd gate lines or even gate lines among the entire gate lines.

Each of the plurality of driving stages SRC1 to SRCs and the dummy driving stages SRCs+1 and SRCs+2 includes input terminals IN1, IN2, and IN3, an output terminal OUT, a carry terminal CR, a control terminal CT, a clock terminal CK, a first ground terminal V1, a second ground terminal V2, and a third ground terminal V3.

The output terminal OUT of each of the plurality of driving stages SRC1 to SRCs is connected to a corresponding gate line among the plurality of gate lines GL1 to GLn. The output terminal OUT of each of the plurality of driving stages SRC1 to SRCs is connected to a corresponding gate line among the plurality of gate lines GL1 to GLn.

The carry terminal CR of each of the plurality of driving stages SRC1 to SRCs is electrically connected to the first input terminal IN1 of the next driving stage of a corresponding driving stage. Additionally, the carry terminal CR of each of the plurality of driving stages SRC1 to SRCs is provided to previous driving stages. For example, the carry terminal CR of the k-th driving stage among the driving stages SRC1 to SRCs is connected to the second input terminal IN2 of the (k−1)-th driving stage and the third input terminal IN3 of the k-2th driving stage. The carry terminal CR of each of the plurality of driving stages SRC1 to SRCs and dummy driving stages SRCs+1 and SRCs+2 outputs a carry signal.

The input terminal IN of each of the plurality of driving stages SRC2 to SRCs and dummy driving stages SRCs+1 and SRCs+2 receives a carry signal of a previous driving stage of a corresponding driving stage. For example, the input terminal IN of the k-th driving stage SRCk receives the carry signal of the (k−1)-th driving stage SRCk−1. The input terminal IN of the first driving stage SRC1 among the plurality of driving stages SRC1 to SRCs receives a vertical start signal STV for starting the drive of the gate driving circuit 100 instead of the carry signal of a previous driving stage.

The second input terminal IN2 of each of the plurality of driving stages SRC1 to SRCs receives a carry signal from the carry terminal CR of the next driving stage of a corresponding driving stage. The third input terminal IN3 of each of the plurality of driving stages SRC1 to SRCs receives a carry signal of the next driving stage of a corresponding driving stage. For example, the second input terminal IN2 of the k-th driving stage SRCk receives a carry signal outputted from the carry terminal CR of the (k+1)-th driving stage SRCk+1. The third input terminal IN3 of the k-th driving stage SRCk receives a carry signal outputted from the carry terminal CR of the (k+2)-th driving stage SRCk+2. According to another embodiment of the inventive concept, the second input terminal IN2 of each of the plurality of driving stages SRC1 to SRCs may be electrically connected to the output terminal OUT of the next driving stage of a corresponding driving stage. Additionally, the third input terminal IN3 of each of the plurality of driving stages SRC1 to SRCs may be electrically connected to the output terminal OUT of the next driving stage of a corresponding driving stage.

The second input terminal IN2 of the driving stage SRCs disposed at the end receives a carry signal outputted from the carry terminal CR of the dummy stage SRCs+1. The third input terminal IN3 of the driving stage SRCs receives a carry signal outputted from the carry terminal CR of the dummy stage SRCs+2.

The clock terminal CK of each of the plurality of driving stages SRC1 to SRCs receives one of the first clock signal CKV and the second clock signal CKVB. Each of the clock terminals CK of the odd driving stages SRC1, SRC3, SRCs−1 among the plurality of driving stages SRC1 to SRCs may receive the first clock signal CKV. Each of the clock terminals CK of the even driving stages SRC2, SRC4, SRCs among the plurality of driving stages SRC1 to SRCs may receive the second clock signal CKVB. The first clock signal CKV and the second clock signal CKVB may be out of phase.

The first ground terminal V1 of each of the plurality of driving stages SRC1 to SRCs receives a first ground voltage VSS1. The second ground voltage VSS2 of each of the plurality of driving stages SRC1 to SRCs receives a second ground voltage VSS2. The third ground terminal V3 of each of the plurality of driving stages SRC1 to SRCs receives a third ground voltage VSS3. The first ground voltage VSS1 and the second ground voltage VSS2 have different voltage levels, and the second ground voltage VSS2 has a lower voltage level than the first ground voltage VSS1. The third ground voltage VSS3 may be set to have a lower level than the first ground voltage VSS1 and a higher level than the second ground voltage VSS2.

According to an embodiment of the inventive concept, each of the plurality of driving stages SRC1 to SRCs may omit one of an output terminal OUT, an input terminal IN, a carry terminal CR, a control terminal CT, a clock terminal CK, a first ground terminal V1, a second ground terminal V2, and a third ground terminal V3, or may further include other terminals. Additionally, the connection relationship of the plurality of driving stages SRC1 to SRCs may be changed.

Figure 6:
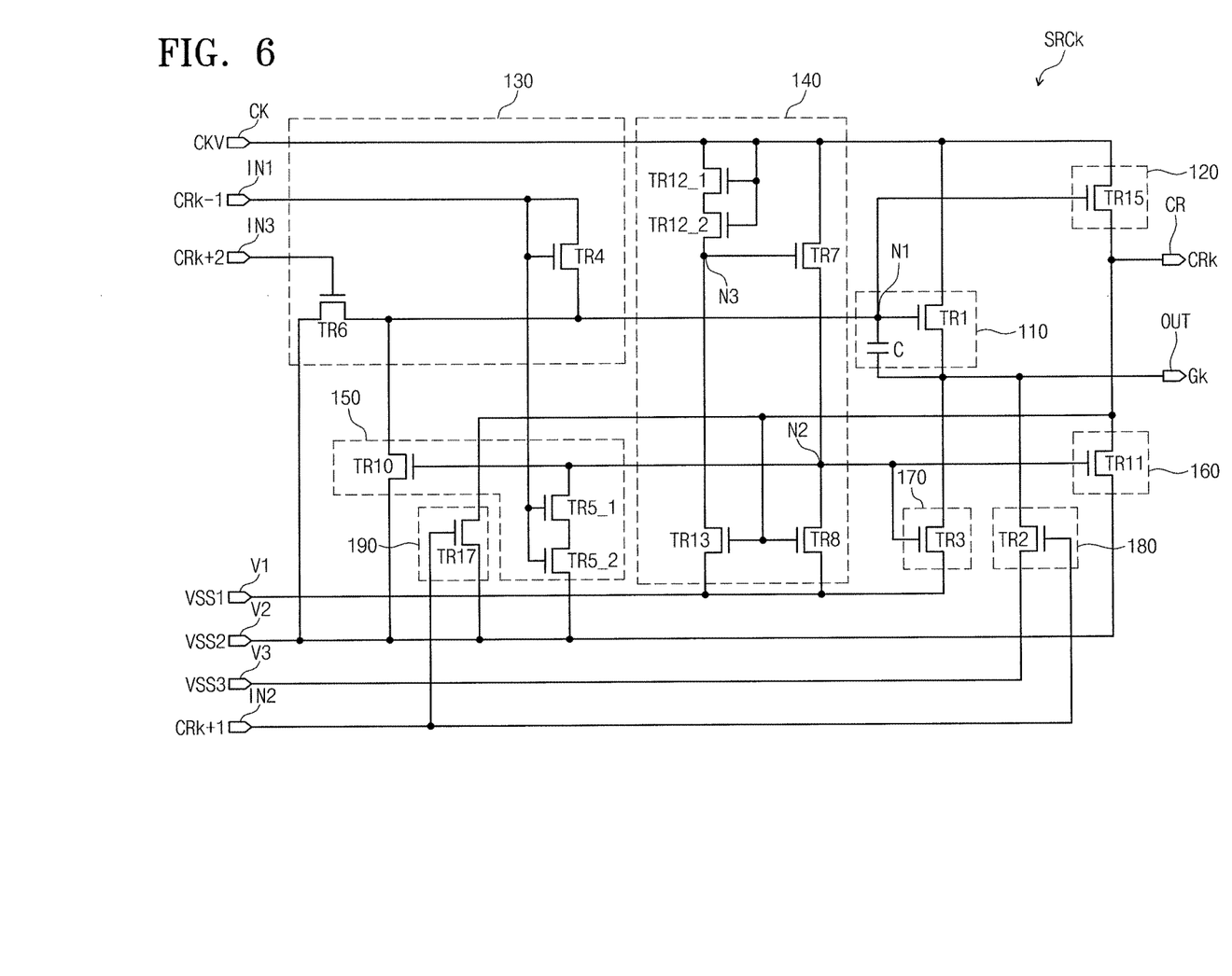
FIG. 6 is a circuit diagram of a driving stage according to an embodiment of the inventive concept.

FIG. 6 is a circuit diagram of a driving stage according to an embodiment of the inventive concept.

FIG. 6 illustrates the k-th driving stage SRCk (where k is a natural number) among the plurality of driving stages SRC1 to SRCs shown in FIG. 5. Each of the plurality of driving stages SRC1 to SRCs shown in FIG. 5 may have the same or substantially the same circuit as the k-th driving stage SRCk.

Referring to FIG. 6, the k-th driving stage SRCk includes a first output unit (e.g., a first output circuit) 110, a second output unit (e.g., a second output circuit) 120, a control unit (e.g., a controller) 130, an inverter unit (e.g., an inverter) 140, a first discharge unit (e.g., a first discharge circuit) 150, a second discharge unit (e.g., a second discharge circuit) 160, a third discharge unit (e.g., a third discharge circuit) 170, a first pull-down unit (e.g., a first pull-down circuit) 180, and a second pull-down unit (e.g., a second pull-down circuit) 190.

The first output unit 110 outputs the k-th gate signal Gk and the second output unit 120 outputs the k-th carry signal CRk. The first pull-down unit 180 pulls down the output terminal OUT to the first ground voltage VSS3 connected to the third ground terminal V3. The second pull-down unit 190 pulls down the carry terminal CR to the second ground voltage VSS2 connected to the second ground terminal V2. The control unit 130 controls operations of the first output unit 110 and the second output unit 120 in response to the (k−1)-th carry signal CRk−1 received through the first input terminal IN from a previous driving stage SRCk−1.

A specific configuration of the k-th driving stage SRCk is as follows.

The first output unit 110 includes a first output transistor TR1 and a capacitor C. The first output transistor TR1 includes a first electrode connected to the clock terminal CK, a control electrode (e.g., gate electrode) connected to the first node N1, and a second node for outputting the k-th gate signal Gk.

The second output unit 120 includes a second output transistor TR15. The second output transistor TR15 includes a first electrode connected to the clock terminal CK, a control electrode (e.g., gate electrode) connected to the first node N1, and a second electrode for outputting the k-th carry signal CRk.

As shown in FIG. 5, each of the clock terminals CK of some driving stages SRC1, SRC3, . . . , SRCs−1 among the plurality of driving stages SRC1 to SRCs and the dummy driving stage SRCs+1 may receive the first clock signal CKV. Each of the clock terminals CK of other driving stages SRC2, SRC4, . . . , SRCs among the plurality of driving stages SRC1 to SRCs and the dummy driving stage SRCs+2 may receive the second clock signal CKVB. The first clock signal CKB and the second clock signal CKVB are complementary signals. That is, the first clock signal CKV and the second clock signal CKVB may have a phase difference of about 180°.

The control unit 130 turns on a first output transistor TR1 and a second output transistor TR2 in response to the (k−1)-th carry signal CRS2 received through the first input terminal IN from a previous driving stage SRCk−1. The control unit 130 turns off the first output transistor TR1 and the second output transistor TR2 in response to the (k+2)th carry signal CRk+2 received through the third input terminal INT3 from the next driving stage SRCk+2.

The control unit 130 includes a fourth transistor TR4 and a sixth transistor TR6. The fourth transistor TR4 includes a first electrode connected to the first input terminal IN1, a second electrode connected to the first node N1, and a control electrode (e.g., gate electrode) connected to the first input terminal IN1. The sixth transistor TR6 includes a first electrode connected to the first node N1, a second electrode connected to the second ground terminal V2, and a control electrode (e.g., gate electrode) connected to the third input terminal IN3.

The inverter unit 140 delivers a clock signal CKV from a clock terminal CK to a second node N2. The inverter unit 140 includes transistors TR7_1, TR7_2, TR8, TR12, and TR13. The seventh transistor TR7 includes a first electrode connected to the clock terminal CK, a second electrode connected to the second node N2, and a control electrode (e.g., gate electrode) connected to the third node N3. The twelfth transistors TR12_1 and TR12_2 are connected in series between the clock terminal CK and the third node N3. The first electrode of the twelfth transistor TR12_1 is connected to the clock terminal CK. The second electrode of the twelfth transistor TR12_2 is connected to the third node N3. The second electrode of the twelfth transistor TR12_1 and the first electrode of the twelfth transistor TR12_1 are connected to each other. The control electrodes of the twelfth transistors TR12_1, TR12_2 are commonly connected to the clock terminal CK. The eighth transistor TR8 includes a first electrode connected to the second node N2, a second electrode connected to the first ground terminal V1, and a control electrode (e.g., gate electrode) connected to the carry terminal CR. The thirteenth transistor TR14 includes a first electrode connected to the third node N3, a second electrode connected to the first ground terminal V1, and a control electrode (e.g., gate electrode) connected to the carry terminal CR.

The first discharge unit 150 discharges the second node N2 to the second ground terminal V2 in response to a previous carry signal CRk−1 and discharges the first node N1 to the second ground terminal V2 in response to a signal at the second node N2. The first discharge unit 150 includes fifth transistors TR5_1 and TR5_2 and a tenth transistor TR10.

The fifth transistors TR5_1 and TR5_2 are connected in series between the second node N2 and the second ground terminal V2. The fifth transistor TR5_1 includes a first electrode connected to the second node N2, a second electrode, and a control electrode (e.g., gate electrode) connected to the first input terminal IN1 for receiving the (k−1)-th carry signal CRk−1. The fifth transistor TR5_2 includes a first electrode, a second electrode connected to the second ground terminal V2, and a control electrode (e.g., gate electrode) connected to the first input terminal IN1 for receiving a previous carry signal CRk−1. The second electrode of the fifth transistor TR5_1 and the first electrode of the fifth transistor TR5_2 are connected to each other.

The tenth transistor TR10 includes a first electrode connected to the first node N1, a second electrode connected to the second ground terminal V2, and a control electrode (e.g., gate electrode) connected to the second node N2.

The second discharge unit 160 discharges the carry terminal CR to the second ground terminal V2 in response to a signal at the second node N2. The second discharge unit 160 includes an eleventh transistor TR11 including a first electrode connected to the carry terminal CR, a second electrode connected to the second ground terminal V2, and a control electrode (e.g., gate electrode) connected to the second node N2.

The third discharge unit 170 discharges the output terminal OUT to the first ground terminal V1 in response to a signal at the second node N2. The third discharge unit 170 includes a third transistor TR3 including a first electrode connected to the output terminal OUT, a second electrode connected to the first ground terminal V1, and a control electrode (e.g., gate electrode) connected to the second node N2.

The first pull-down unit 180 discharges the output terminal OUT to the third ground terminal V3 in response to the (k+1)-th carry signal CRk+1 received through the second input terminal IN2. The first pull-down unit 180 includes a second transistor TR3 including a first electrode connected to the output terminal OUT, a second electrode connected to the third ground terminal V3, and a control electrode (e.g., gate electrode) connected to the second input terminal IN2.

The second pull-down unit 190 discharges the carry terminal CR to the second ground terminal V2 in response to the (k+1)-th carry signal CRk+1 received through the second input terminal IN2. The second pull-down unit 190 includes a seventeenth transistor TR17 including a first electrode connected to the carry terminal CR, a second electrode connected to the second ground terminal V2, and a control electrode (e.g., gate electrode) connected to the second input terminal IN2.

Figure 7:
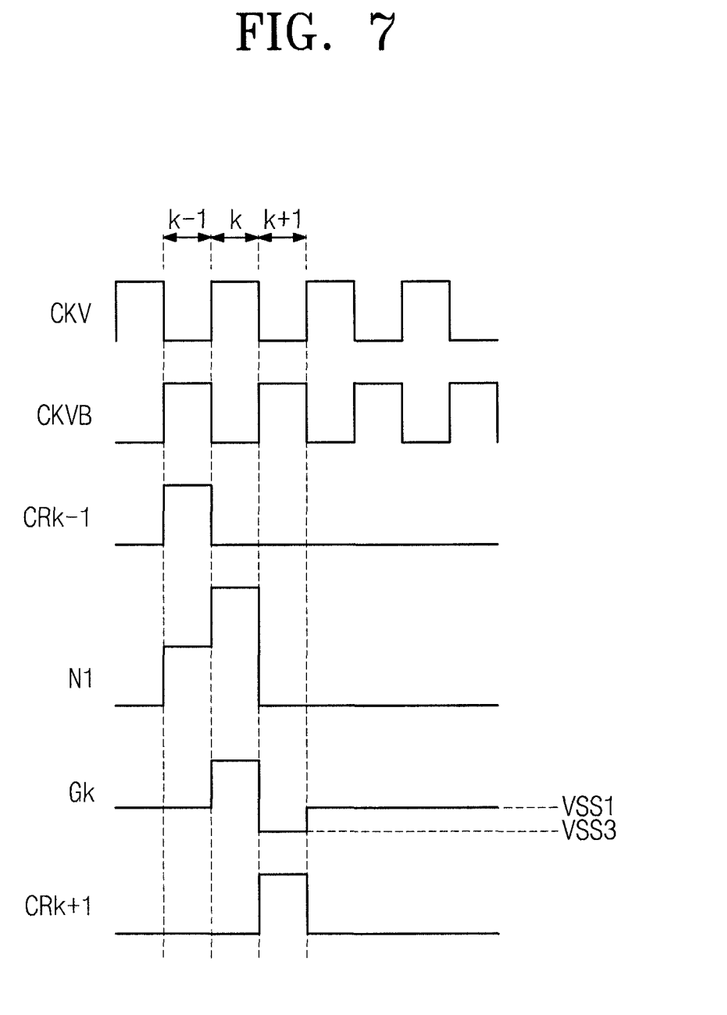
FIG. 7 is a timing diagram illustrating an operation of the k-th driving stage shown in FIG. 6.

FIG. 7 is a timing diagram illustrating an operation of the k-th driving stage shown in FIG. 6.

Referring to FIGS. 6 and 7, the first clock signal CKV and the second clock signal CKVB may have the same frequency and be out of phase.

If the (k−1)-th carry signal CRk−1 transitions to a high level in the (k−1)-th clock period k−1, the transistor TR4 is turned on, so that a level voltage of the first node N1 rises. If the first clock signal CKV transitions to a high level in the k-th clock period k, the first output transistor TR1 is turned on, so that a voltage of the first node N1 is boosted by the capacitor C. At this point, the k-th gate signal Gk is outputted through the output terminal OUT. If the second output transistor TR2 is turned on by the boosted voltage of the first node N1, the k-th carry signal CRk is outputted through the carry terminal CR.

If the (k+1)-th carry signal CRk+1 transitions to a high level in the (k+1)-th clock period k+1, the second transistor TR2 in the first pull-down unit 180 is turned on, so that the k-th gate signal Gk of the output terminal OUT is discharged to the third ground voltage VSS3. If the seventeenth transistor TR17 in the second pull-down unit 190 is turned on in response to the (k+1)-th carry signal CRk+1 of a high level, the k-th carry signal CRk of the carry terminal CR is discharged as the second ground voltage VSS2.

In this embodiment, the second ground voltage VSS2 has a lower voltage level than the first ground voltage VSS1. The third ground voltage VSS3 has a lower voltage level than the first ground voltage VSS1 and a higher voltage level than the second ground voltage VSS2 (VSS1>VSS3>VSS2).

Because the k-th gate signal Gk of the output terminal OUT is discharged as the third ground voltage VSS3 having a lower voltage level than the first ground voltage VSS1 during the (k+1)-th clock period k+1, the discharge speed of the k-th gate signal Gk may be improved (e.g., be increased). If the resolution of the display panel DP shown in FIG. 1 is increased, one horizontal period becomes shorter, so that a time for charging each pixel with electric charges is reduced. As the discharge speed of the gate signal Gk becomes faster, a pixel charging time may be secured. Therefore, the display quality of a display device may be improved.

The second transistor TR2 in the first pull-down unit 180 discharges the third ground VSS3 of the third ground terminal V3 to the output terminal OUT in response to the (k+1)-th carry signal CRk+1. As a voltage level of the third ground voltage VSS3 becomes lower, the discharge speed of the k-th gate signal Gk of the output terminal OUT may become faster. However, when a voltage level of the third ground voltage VSS3 becomes lower, the second transistor TR2 becomes vulnerable to high temperature reliability. Therefore, the third ground voltage VSS3 may be set within a range for improving (e.g., increasing) the discharge speed of the gate signal Gk and maintaining the high temperature reliability of the second transistor TR2. For example, the first ground voltage VSS1 may be set to −7.5 V (or about −7.5 V), the second ground voltage VSS2 may be set to −11.5 V (or about −11.5 V), and the third ground voltage VSS3 may be set to −10 V (or about −10V).

A gate driving circuit having such a configuration may improve (e.g., increase) the discharge speed of a gate signal by discharging a gate signal as a voltage lower than a first voltage. As the delay of the gate signal is reduced, a pixel charging time may be secured. Therefore, the display quality of a display device may be improved.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

It will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept."

Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

The display device and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the display device may be formed on one integrated circuit (IC) chip or on separate IC chips. Further, the various components of the display device may be implemented on a flexible printed circuit film, a tape carrier package (TCP), a printed circuit board (PCB), or formed on a same substrate. Further, the various components of the display device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A gate driving circuit comprising a plurality of stages, a k-th stage (where k is a natural number) of the plurality of stages being configured to receive a clock signal, a (k−1)-th carry signal from a (k−1)-th stage of the plurality of stages, a (k+1)-th carry signal from a (k+1)-th stage of the plurality of stages, a (k+2)-th carry signal from a (k+2)-th stage of the plurality of stages, a first ground voltage, a second ground voltage, and a third ground voltage, and to output a k-th gate signal and a k-th carry signal, the k-th stage comprising a first pull down circuit configured to discharge the k-th gate signal as the third ground voltage in response to the (k+1)-th carry signal, a third discharge circuit configured to discharge the k-th gate signal as the first ground voltage in response to a signal at a second node, and a second pull-down circuit configured to discharge the k-th carry signal as the second ground voltage in response to the (k+1)-th carry signal, and the third ground voltage having a lower voltage level than the first ground voltage and having a higher voltage level than the second ground voltage, wherein the k-th gate signal is discharged as the third ground voltage when the (k+1)-th carry signal transitions to a high level in a (k+1)-th clock period, and the k-th gate signal is discharged as the first ground voltage having a higher voltage level than the third ground voltage during a subsequent clock period of the (k+1)-th clock period.

2. The gate driving circuit of claim 1, wherein the second pull-down circuit comprises a transistor comprising a first electrode connected to the k-th gate signal, a second electrode connected to the third ground voltage, and a gate electrode connected to the (k+1)-th carry signal.

3. The gate driving circuit of claim 1, wherein the k-th stage comprises:
   a controller configured to provide one of the clock signal and the second ground voltage to a first node in response to the clock signal, the (k−1)-th carry signal, and the (k+1)-th carry signal; and
   a first output circuit configured to output the clock signal as the k-th gate signal in response to a signal at the first node.

4. The gate driving circuit of claim 3, wherein the k-th stage further comprises a second output circuit configured to output the clock signal as the k-th carry signal in response to the signal at the first node.

5. The gate driving circuit of claim 3, wherein the k-th stage further comprises:
   an inverter configured to provide the clock signal to the second node;
   a first discharge circuit configured to discharge the first node to the second ground voltage in response to the signal at the second node and discharge the second node to the second ground voltage in response to the (k−1)-th carry signal; and
   a second discharge circuit configured to discharge the k-th carry signal as the second ground voltage in response to the signal at the second node.

6. A display device comprising:
   a display panel comprising a plurality of pixels respectively connected to a plurality of gate lines and a plurality of data lines;
   a gate driving circuit comprising a plurality of stages configured to output gate signals to the plurality of gate lines; and
   a data driving circuit configured to drive the plurality of data lines,
   wherein a k-th stage (where k is a natural number) among the plurality of stages is configured to receive a clock signal, a (k−1)-th carry signal from a (k−1)-th stage among the plurality of stages, a (k+1)-th carry signal from a (k+1)-th stage among the plurality of stages, a (k+2)-th carry signal from a (k+2)-th stage among the plurality of stages, a first ground voltage, a second ground voltage, and a third ground voltage, and to output a k-th gate signal and a k-th carry signal,
   wherein the k-th stage comprises a first pull down circuit configured to discharge the k-th gate signal as the third ground voltage in response to the (k+1)-th carry signal, and a third discharge circuit configured to discharge the k-th gate signal as the first ground voltage in response to a signal at a second node, and a second pull-down circuit configured to discharge the k-th carry signal as the second ground voltage in response to the (k+1)-th carry signal,
   wherein the third ground voltage has a lower voltage level than the first ground voltage and has a higher voltage level than the second ground voltage, and
   wherein the k-th gate signal is discharged as the third ground voltage when the (k+1)-th carry signal transitions to a high level in a (k+1)-th clock period, and the k-th gate signal is discharged as the first ground voltage having a higher voltage level than the third ground voltage during a subsequent clock period of the (k+1)-th clock period.

7. The display device of claim 6, wherein the second pull-down circuit comprises a transistor comprising a first electrode connected to the k-th gate signal, a second electrode connected to the third ground voltage, and a gate electrode connected to the (k+1)-th carry signal.

8. The display device of claim 6, wherein the k-th stage comprises:
   a controller configured to provide one of the clock signal and the second ground voltage to a first node in response to the clock signal, the (k−1)-th carry signal, and the (k+1)-th carry signal; and
   a first output circuit configured to output the clock signal as the k-th gate signal in response to a signal at the first node.

9. The display device of claim 8, wherein the k-th stage further comprises a second output circuit configured to output the clock signal as the k-th carry signal in response to the signal at the first node.

10. The display device of claim 8, wherein the k-th stage further comprises:
   an inverter configured to provide the clock signal to the second node;
   a first discharge circuit configured to discharge the first node to the second ground voltage in response to the signal at the second node and discharge the second node to the second ground voltage in response to the (k−1)-th carry signal; and
   a second discharge circuit configured to discharge the k-th carry signal as the second ground voltage in response to the signal at the second node.

11. The display device of claim 6, wherein the display panel has a display area where the plurality of pixels are arranged, and a non-display area adjacent to the display area, wherein the gate driving circuit is integrated in the non-display area.

12. The display device of claim 6, wherein the first ground voltage and the second ground voltage have different voltage levels.

* * * * *